US012609169B2

(12) United States Patent
Hung et al.

(10) Patent No.: US 12,609,169 B2
(45) Date of Patent: Apr. 21, 2026

(54) MEMORY DEVICE AND DATA ACCESSING METHOD THEREOF

(71) Applicant: MACRONIX International Co., Ltd., Hsinchu (TW)

(72) Inventors: Chun-Hsiung Hung, Hsin-Chu (TW); Hsin-Yi Ho, Hsinchu City (TW)

(73) Assignee: MACRONIX International Co., Ltd., Hsinchu (TW)

( * ) Notice: Subject to any disclaimer, the term of this patent is extended or adjusted under 35 U.S.C. 154(b) by 196 days.

(21) Appl. No.: 18/741,780

(22) Filed: Jun. 13, 2024

(65) Prior Publication Data

US 2025/0384935 A1 Dec. 18, 2025

(51) Int. Cl.
*G11C 16/24* (2006.01)
*G11C 16/08* (2006.01)
*G11C 16/26* (2006.01)
*G11C 16/32* (2006.01)

(52) U.S. Cl.
CPC .............. *G11C 16/26* (2013.01); *G11C 16/08* (2013.01); *G11C 16/32* (2013.01)

(58) Field of Classification Search
CPC .................................................... G11C 16/24
See application file for complete search history.

(56) References Cited

U.S. PATENT DOCUMENTS

2023/0017909 A1* 1/2023 Sanuki ................... G11C 16/24
2023/0162795 A1 5/2023 Choi et al.

FOREIGN PATENT DOCUMENTS

TW 201413722 4/2014
TW 201711029 3/2017

OTHER PUBLICATIONS

"Office Action of Taiwan Counterpart Application", issued on Feb. 21, 2025, p1-p4.

* cited by examiner

*Primary Examiner* — Jason Lappas
(74) *Attorney, Agent, or Firm* — J.C. PATENTS

(57) ABSTRACT
A data accessing method of a memory device includes the following steps. During a first time period, a read voltage is applied to a first read selected word line in a first memory cell block. During a first data reading time period in the first time period, at least one first memory cell string in the first memory cell block is activated. During a second time period, the read voltage is applied to a second read selected word line in a second memory cell block. The first time period partially overlaps the second time period. During a second data reading time period in the second time period, at least one second memory cell string in the second memory cell block is activated. The first data reading time period does not overlap the second data reading time period.

20 Claims, 3 Drawing Sheets

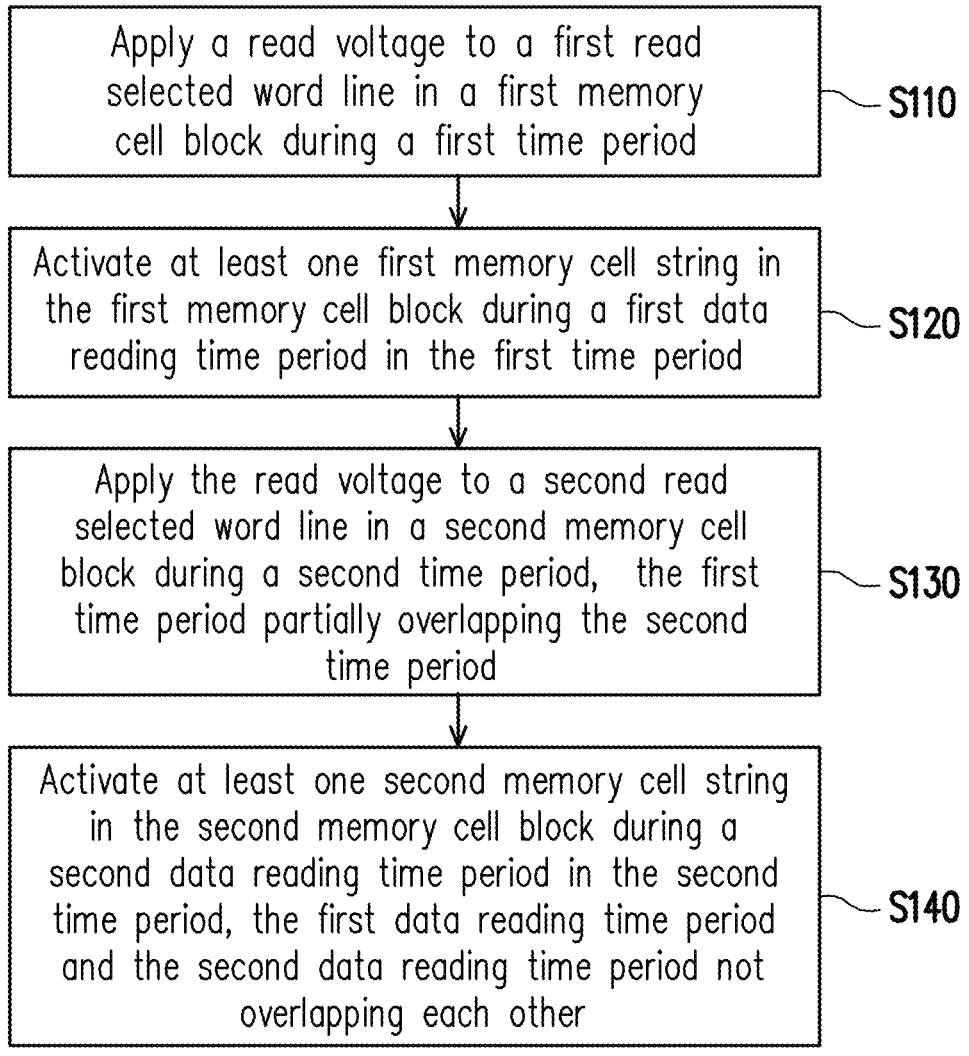

Apply a read voltage to a first read selected word line in a first memory cell block during a first time period ～S110

Activate at least one first memory cell string in the first memory cell block during a first data reading time period in the first time period ～S120

Apply the read voltage to a second read selected word line in a second memory cell block during a second time period, the first time period partially overlapping the second time period ～S130

Activate at least one second memory cell string in the second memory cell block during a second data reading time period in the second time period, the first data reading time period and the second data reading time period not overlapping each other ～S140

FIG. 1

MEMORY DEVICE AND DATA ACCESSING METHOD THEREOF

BACKGROUND

Technical Field

The disclosure relates to a memory device and a data accessing method thereof, and in particular, to a memory device and a data accessing method thereof capable of increasing a data read speed.

Description of Related Art

In the conventional technical field of NAND flash memory devices, when performing a data read operation on a memory cell block, a read voltage is first applied to a read selected word line in the memory cell block, and a pass voltage is applied to unselected word lines in the memory cell block. When the voltage values of the read voltage and the pass voltage are stabilized, a storage data in a selected memory cell is read by activating a memory cell string. When a next data read operation is to be performed, the read voltage and the pass voltage are re-applied to the word line to be read in the memory cell block. The storage data in the selected memory cell can only be read after the read voltage and the pass voltage rise to stabilized voltage values. In other words, in the continuous data read operations on multiple memory cell blocks, a lot of time is consumed due to repeated waits for the stabilization of the read voltage and the pass voltage, which reduces the operation efficiency of the memory device.

SUMMARY

The disclosure provides a memory device and a data accessing method thereof capable of increasing a data reading speed.

The data accessing method of the memory device of the disclosure includes the following steps. During a first time period, a read voltage is applied to a first read selected word line in a first memory cell block. During a first data reading time period in the first time period, at least one first memory cell string in the first memory cell block is activated. During a second time period, the read voltage is applied to a second read selected word line in a second memory cell block. The first time period partially overlaps the second time period. During a second data reading time period in the second time period, at least one second memory cell string in the second memory cell block is activated. The first data reading time period does not overlap the second data reading time period.

The data accessing method of the memory device of the disclosure includes: dividing a plurality of memory cell blocks corresponding to a plurality of word lines of the memory device; setting a first memory cell block and a second memory cell block according to a reading order; when at least one first memory cell string of the first memory cell bock is enabled to perform a reading operation, performing a pre-set operation on word lines of the second memory cell block; and after the reading operation of the at least one first memory cell string of the first memory cell bock has been completed, enabling at least one second memory cell of the second memory cell block.

The memory device of the disclosure includes multiple memory cell blocks and a controller. The controller is coupled to the memory cell blocks and configured to perform the data accessing methods as described above.

Based on the above, the memory device of the disclosure is capable of, by performing a preset operation on word lines of next accessed memory block, performing data read operations on different memory cell blocks continuously during the first time period and the second time period that partially overlap each other. This way, the first data reading time period and the second data reading time period corresponding to different memory cell blocks may be generated consecutively, thereby effectively improving an efficiency in reading data of memory cells.

BRIEF DESCRIPTION OF THE DRAWINGS

FIG. 1 shows a flowchart of a data accessing method of a memory device in an embodiment of the disclosure.

DESCRIPTION OF THE EMBODIMENTS

Figure 2:
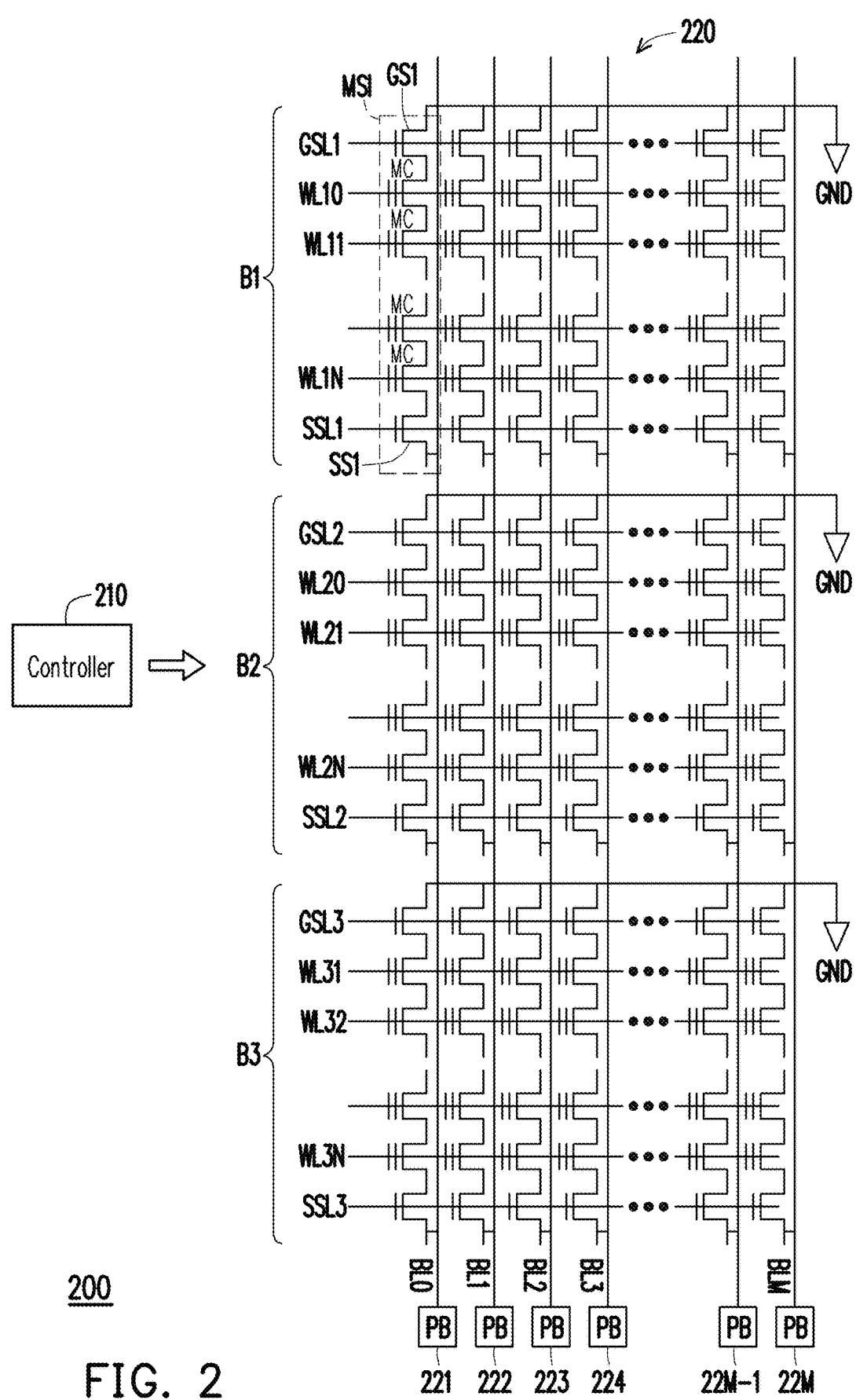
FIG. 2 shows a schematic diagram of a memory device in an embodiment of the disclosure.

Referring to FIG. 1, FIG. 1 shows a flowchart of a data accessing method of a memory device in an embodiment of the disclosure. In this embodiment, the memory device includes multiple memory cell blocks, and each of the memory cell blocks has one or more memory cell strings. Multiple memory cells on each of the memory cell strings may be respectively coupled to multiple word lines. In this embodiment, the memory device may be a NAND flash memory device.

In Step S110 of a process of the data accessing method in this embodiment, during a first time period, a controller of the memory device may apply a read voltage to a first read selected word line in a first memory cell block among multiple memory cell blocks. Next, in Step S120, during a first data reading time period in the first time period, the controller may activate at least one first memory cell string in the first memory cell block. As a result, in the activated one or more first memory cell strings in the first memory cell block, a data stored in a memory cell corresponding to the first read selected word line may be read during the first data reading time period.

In addition, in Step S130, during a second time period, the controller of the memory device may apply the read voltage to a second read selected word line in a second memory cell block among the multiple memory cell blocks. The second time period may be different from the first time period. In detail, the second time period may partially overlap the first time period, but the second time period and the first time period do not overlap each other completely.

Next, in Step S140, during a second data reading time period in the second time period, the controller may activate at least one second memory cell string in the second memory cell block. As a result, in the activated one or more second memory cell strings in the second memory cell block, a data stored in a memory cell corresponding to the second read selected word line may be read during the second data reading time period.

In this embodiment, the first data reading time period and the second data reading time period do not overlap each other at all. In the first data reading time period, a data being read from a memory cell corresponding to the first read selected word line may be sent out through a corresponding bit line. In the first data reading time period, a data being read from a memory cell corresponding to the second read selected word line may also be sent out through a corresponding bit line. In this embodiment, the memory cell corresponding to the first read selected word line and the memory cell corresponding to the second read selected word line may correspond to the same bit line.

In this embodiment, when a data read operation on the first memory cell block is not yet completed during the first time period, the controller of the memory device may apply the read voltage to the second read selected word line in the second memory cell block in advance during a time period where the second time period overlaps the first time period. This way, after an executed data read operation on the memory cells in the first memory cell block is completed during the first data reading time period in the first time period, the controller of the memory device may perform a data read operation on the memory cells in the second memory cell block immediately in the second data reading time period subsequent to the first data reading time period. This way, an efficiency in reading storage data in memory cells in multiple memory blocks can be effectively improved.

Referring to FIG. 2, FIG. 2 shows a schematic diagram of a memory device in an embodiment of the disclosure. A memory device 200 includes multiple memory cell blocks B1 to B3 and a controller 210. The controller 210 is coupled to the memory cell blocks B1 to B3. In this embodiment, each of the memory cell blocks B1 to B3 includes multiple memory cell strings (e.g., a memory cell string MS1). The memory cell strings in each of the memory cell blocks B1 to B3 are respectively coupled to multiple bit lines BL0 to BLM. The bit lines BL0 to BLM are respectively coupled to multiple page buffers 221 to 22M.

Multiple memory cells in the memory cell block B1 are coupled to word lines WL10 to WL1N. Multiple memory cells in the memory cell block B2 are coupled to word lines WL20 to WL2N. Multiple memory cells in the memory cell block B3 are coupled to word lines WL30 to WL3N. The memory cell strings in the memory cell blocks B1, B2, and B3 respectively correspond to each other and are respectively coupled to the bit lines BL0 to BLM. In other words, in the memory cell blocks B1, B2, and B3, three memory cell strings corresponding to each other in position may be coupled to a same common bit line.

In terms of the implementation details with respect to the memory cell string MS1, the memory cell string MS1 has multiple memory cells MC connected to each other in series. The memory cell string MS1 also has a memory cell string selection switch SS1 and a ground selection switch GS1 coupled to both ends of the memory cell string MS1. Control terminals of the memory cells MC are respectively coupled to the word lines WL10 to WL1N. The ground selection switch GS1 is coupled between the memory cells MC and a reference ground terminal GND. The memory cell string selection switch SS1 is coupled between the memory cell MC and the corresponding bit line BL0. The ground selection switch GS1 is controlled by a control signal GSL1, and the memory cell string selection switch SS1 is controlled by a control signal SSL1.

In this embodiment, the controller 210 may be a processor capable of computing. Alternatively, the controller 210 may be a digital circuit of any form, or a hardware circuit being designed through a hardware description language (HDL) or by any other design method of digital circuits known by a person skilled in the art and then realized through field programmable gate arrays (FPGA), complex programmable logic devices (CPLD), or application specific integrated circuits (ASIC).

Figure 3:
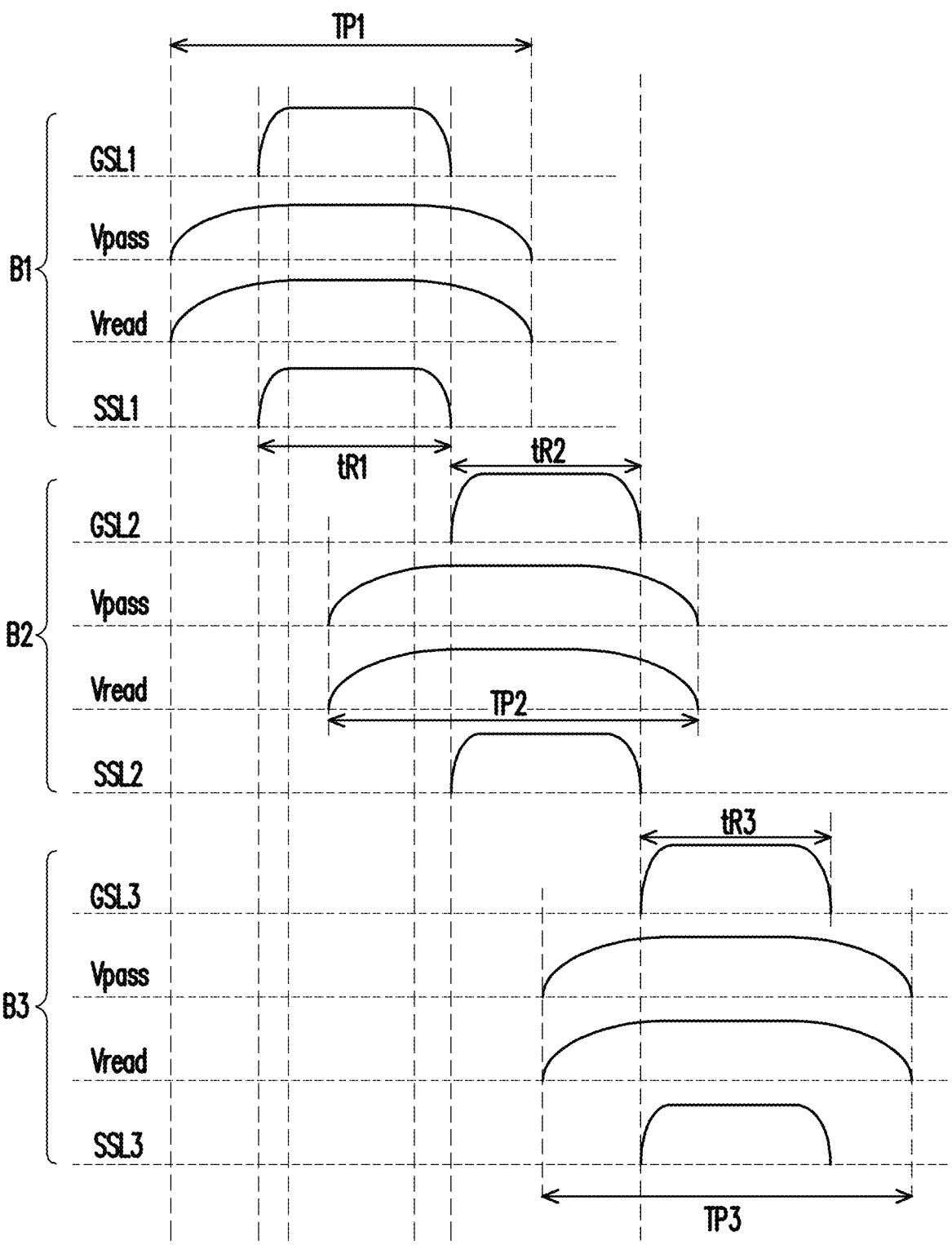
FIG. 3 shows an operational waveform diagram of a memory device in an embodiment of the disclosure.

In terms of the details of data read operations of the memory device 200, reference may be made to both FIGS. 2 and 3. FIG. 3 shows an operational waveform diagram of a memory device in an embodiment of the disclosure. In FIG. 3, the controller 210 of the memory device 200 may perform a data read operation on the memory cell block B1 first. Moreover, during a first time period TP1, the controller 210 may apply a read voltage Vread to a read selected word line that is selected for a data read operation in the memory cell block B1, and apply a pass voltage Vpass to unselected word lines other than the read selected word line.

Next, during the first time period TP1, after the read voltage Vread and the pass voltage Vpass are raised to stabilized voltage values, the controller 210 may respectively apply the control signals SSL1 and GSL1 to the ground selection switch and the memory cell string selection switch of the memory cell string in the memory cell block B1 during a first reading time period tR1. Through the control signals SSL1 and GSL1 having relatively high voltage values, the ground selection switch and the memory cell string selection switch of the memory cell string in the memory cell block B1 are turned on, and the memory cell string in the memory cell block B1 is activated.

In this embodiment, the pass voltage Vpass may be greater than the read voltage Vread. After the memory cell string in the memory cell block B1 is activated, the memory cell (unselected memory cell) receiving the pass voltage Vpass in the memory cell block B1 is completely conducted without affecting a current on the corresponding bit line. The memory cell (selected memory cell) receiving the read voltage Vread may generate a current on the bit line according to a stored data. Therefore, the memory device 200 learns about the data stored in the selected memory cells respectively corresponding to the multiple memory cell strings in the memory cell block B1 by sensing current intensities on the bit lines BL0 to BLM.

In this embodiment, a second time period TP2 partially overlaps the first time period TP1, and the second time period TP2 may also partially overlap the first reading time period tR1 in the first time period TP1. That is, while the data read operation is being performed on the memory cell block B1, during the second time period TP2, the controller may apply the read voltage Vread to a read selected word line that is selected for a data read operation in a memory cell block B2, and apply the pass voltage Vpass to unselected word lines other than the read selected word line.

As can be seen in FIG. 3, the read voltage Vread and the pass voltage Vpass corresponding to the second memory cell block may be applied on each of the corresponding word lines in the memory cell block B2 in advance to perform a pre-set operation on word lines of the memory cell block B2 while the data read operation is performed on the memory cell block B1. Further, the read voltage Vread and the pass voltage Vpass on each of the word lines in the memory cell block B2 may reach a stabilized state before the first reading time period tR1 is over. This way, after the first reading time period tR1 is over, during a second reading time period tR2, the controller 210 may turn on the ground selection switch and the memory cell string selection switch of the memory cell string in the memory cell block B2 by providing control signals SSL2 and GSL2 having relatively high voltage values, and perform a data read operation on the memory cells in the memory cell block B2.

In this embodiment, the second reading time period tR2 may occur after the first reading time period tR1. The second reading time period tR2 may also be closely adjacent to the first reading time period tR1.

In this embodiment of the disclosure, the controller 210 of the memory device 200 may continue to perform a data read operation on the memory cells in the memory cell block B3 after the data read operation on the memory cells in the memory cell block B2. During a third time period TP3 that partially overlaps the second time period TP2 and the second reading time period tR2, the controller 210 may provide the read voltage Vread and the pass voltage Vpass to each word line in the memory cell block B3 in advance. Then, during a third reading time period tR3 subsequent to the second reading time period tR2, the controller 210 may turn on the ground selection switch and the memory cell string selection switch of the memory cell string in the memory cell block B3 by providing control signals SSL3 and GSL3 having relatively high voltage values, and perform a data read operation on the memory cells in the memory cell block B3.

As can be seen from the above embodiments, the memory device 200 in the embodiments of the disclosure is capable of switching between the different memory cell blocks B1 to B3 promptly so as to perform data read operations. Further, before the data read operation on a previous block is completed, the memory device 200 provides the read voltage Vread and the pass voltage Vpass in advance to a next memory cell block on which a data read operation is to be performed so as to effectively reduce the waiting time for the read voltage Vread and the pass voltage Vpass rising to a stabilized state, thereby improving the data read speed of the memory device 200.

In the embodiment of FIG. 3, after the data read operation on the memory cell block B3, the controller 210 may proceed to perform data read operations on the memory cell blocks B1 and B2 or other unshown memory cell blocks. In the embodiments of the disclosure, the controller 210 may continuously perform data read operations on any two different memory cell blocks. The method of sequentially performing data read operations on the memory cell blocks B1 to B3 shown in FIG. 3 simply serves as an exemplary embodiment and does not limit the scope of implementation of the disclosure.

The data read operations in the embodiments of the disclosure may also be applied to other types of memory devices and are not limited to being applied to NAND flash memory devices.

In addition, in other embodiments of the disclosure, a demand data may be split into multiple data pages and stored in different memory cell blocks sequentially in advance according to a pre-set order. This way, when a data read operation is to be performed on the demand data, the embodiment of FIG. 3 of the disclosure may be applied so as to perform a fast data read operation on each memory cell block sequentially in a reading order according to the storage order of the data pages. This way, the demand data is promptly read and the performance of the system is improved.

In summary, during a data read operation on a current memory cell block, the memory device of the disclosure applies a corresponding read voltage and a corresponding pass voltage to word lines of a next memory cell block subject to a next data read operation in advance. This way, the waiting time for the stabilization of the read voltage and the pass voltage on the word lines is eliminated during the continuous data read operations on memory cell blocks, thereby effectively improving an efficiency in reading data of memory cells.

What is claimed is:

1. A data accessing method of a memory device, comprising:

applying a read voltage to a first read selected word line in a first memory cell block during a first time period;

activating at least one first memory cell string in the first memory cell block during a first data reading time period in the first time period;

applying the read voltage to a second read selected word line in a second memory cell block during a second time period, wherein the first time period partially overlaps the second time period; and activating at least one second memory cell string in the second memory cell block during a second data reading time period in the second time period, wherein the first data reading time period and the second data reading time period do not overlap each other.

2. The data accessing method of claim 1, wherein the first data reading time period is closely adjacent to the second data reading time period.

3. The data accessing method of claim 1, further comprising:

applying a pass voltage to a plurality of first unselected word lines in the first memory cell block during the first time period; and applying the pass voltage to a plurality of second unselected word lines in the second memory cell block during the second time period.

4. The data accessing method of claim 3, wherein the pass voltage is greater than the read voltage.

5. The data accessing method of claim 1, wherein activating the at least one first memory cell string in the first memory cell block comprises:

raising a first control signal and a second control signal during the first data reading time period to respectively turn on a ground selection switch and a memory cell string selection switch of the at least one first memory cell string.

6. The data accessing method of claim 1, wherein activating the at least one second memory cell string in the second memory cell block comprises:

raising a first control signal and a second control signal during the second data reading time period to respectively turn on a ground selection switch and a memory cell string selection switch of the at least one second memory cell string.

7. The data accessing method of claim 1, further comprising:

applying the read voltage to a third read selected word line in a third memory cell block during a third time period, wherein the second time period partially overlaps the third time period; and activating at least one third memory cell string in the third memory cell block during a third data reading time period in the third time period, wherein the first data reading time period, the second data reading time period, and the third data reading time period do not overlap each other.

8. A memory device comprising:
a plurality of memory cell blocks; and
a controller coupled to the plurality of memory cell blocks and configured to:
apply a read voltage to a first read selected word line in a first memory cell block during a first time period;
activate at least one first memory cell string in the first memory cell block during a first data reading time period in the first time period;
apply the read voltage to a second read selected word line in a second memory cell block during a second time period, wherein the first time period partially overlaps the second time period; and activate at least one second memory cell string in the second memory cell block during a second data reading time period in the second time period, wherein the first data reading time period and the second data reading time period do not overlap each other.

9. The memory device of claim 8, wherein the first data reading time period is closely adjacent to the second data reading time period.

10. The memory device of claim 8, wherein the controller is further configured to:

apply a pass voltage to a plurality of first unselected word lines in the first memory cell block during the first time period; and apply the pass voltage to a plurality of second unselected word lines in the second memory cell block during the second time period.

11. The memory device of claim 10, wherein the pass voltage is greater than the read voltage.

12. The memory device of claim 8, wherein the at least one first memory cell string comprises a ground selection switch and a memory cell string selection switch, and the controller is further configured to:

raise a first control signal and a second control signal during the first data reading time period to respectively turn on the ground selection switch and the memory cell string selection switch of the at least one first memory cell string.

13. The memory device of claim 8, wherein the at least one second memory cell string comprises a ground selection switch and a memory cell string selection switch, and the controller is further configured to:

raise a first control signal and a second control signal during the second data reading time period to respectively turn on the ground selection switch and the memory cell string selection switch of the at least one second memory cell string.

14. The memory device of claim 8, wherein the controller is further configured to:

apply the read voltage to a third read selected word line in a third memory cell block during a third time period, wherein the second time period partially overlaps the third time period; and activate at least one third memory cell string in the third memory cell block during a third data reading time period in the third time period, wherein the first data reading time period, the second data reading time period, and the third data reading time period do not overlap each other.

15. The memory device of claim 8, wherein the at least one first memory cell string and the at least one second memory cell string are respectively coupled to at least one first bit line and at least one second bit line.

16. The memory device of claim 8, wherein the at least one first memory cell string and the corresponding at least one second memory cell string share a same common bit line.

17. The memory device of claim 16, further comprising:

at least one page buffer coupled to the common bit line.

18. A data accessing method of a memory device, comprising:

dividing a plurality of memory cell blocks corresponding to a plurality of word lines of the memory device;

setting a first memory cell block and a second memory cell block according to a reading order;

when at least one first memory cell string of the first memory cell block is enabled to perform a reading operation, performing a pre-set operation on word lines of the second memory cell block; and after the reading operation of the at least one first memory cell string of the first memory cell block has been completed, enabling at least one second memory cell of the second memory cell block.

19. The data accessing method of claim 18, further comprising:

dividing a demand data to a plurality of data pages; and storing the data pages sequentially to the memory cell blocks of the memory device.

20. The data accessing method of claim 18, wherein a step of performing the pre-set operation on word lines of the second memory cell block comprises:

applying a read voltage on a reading selected word line of the second memory cell block; and applying a pass voltage on a plurality of unselected word lines of the second memory cell block.

* * * * *